US009748976B2

(12) United States Patent
Naaman et al.

(10) Patent No.: US 9,748,976 B2
(45) Date of Patent: Aug. 29, 2017

(54) FAULT TOLERANT SYNDROME EXTRACTION AND DECODING IN BACON-SHOR QUANTUM ERROR CORRECTION

(71) Applicants: Ofer Naaman, Ellicott City, MD (US); Bryan K. Eastin, Lafayette, CO (US)

(72) Inventors: Ofer Naaman, Ellicott City, MD (US); Bryan K. Eastin, Lafayette, CO (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 84 days.

(21) Appl. No.: 14/720,315

(22) Filed: May 22, 2015

(65) Prior Publication Data

US 2016/0344414 A1    Nov. 24, 2016

(51) Int. Cl.
| | | |
|---|---|---|
| *H03M 13/00* | (2006.01) | |
| *H03M 13/15* | (2006.01) | |
| *G06N 99/00* | (2010.01) | |

(52) U.S. Cl.
CPC ...... *H03M 13/1575* (2013.01); *G06N 99/002* (2013.01); *H03M 13/157* (2013.01); *H03M 13/1525* (2013.01)

(58) Field of Classification Search
CPC ........... H03M 13/1575; H03M 13/005; H03M 13/157; G06N 99/002
See application file for complete search history.

(56) References Cited

U.S. PATENT DOCUMENTS

| | | | | |
|---|---|---|---|---|
| 6,597,010 | B2 * | 7/2003 | Eriksson | B82Y 10/00 257/12 |
| 7,184,555 | B2 * | 2/2007 | Whaley | B82Y 10/00 380/256 |
| 8,242,799 | B2 * | 8/2012 | Pesetski | G06N 99/002 326/1 |
| 8,489,163 | B2 | 7/2013 | Herr et al. | |
| 8,510,618 | B1 * | 8/2013 | Pesetski | G06F 11/1048 257/34 |
| 9,059,746 | B2 * | 6/2015 | Dixon | H03M 13/6312 |
| 9,130,598 | B2 * | 9/2015 | Goto | H03M 13/3961 |

(Continued)

OTHER PUBLICATIONS

Fowler, Austin G., Adam C. Whiteside, and Lloyd CL Hollenberg. "Towards practical classical processing for the surface code," *Physical review letters* 108.18 (2012): 180501.

(Continued)

*Primary Examiner* — Esaw Abraham
(74) *Attorney, Agent, or Firm* — Tarolli, Sundheim, Covell & Tummino LLP

(57) ABSTRACT

Systems and methods are provided for quantum error correction. A quantum system includes an array of qubits configured to store an item of quantum information. The array of qubits includes a plurality of data qubits and a plurality of measurement qubits configured to extract a syndrome representing agreement among the plurality of data qubits. The quantum system further includes an integrated circuit comprising validation logic configured to determine if the syndrome is valid, decoding logic configured to determine evaluate the syndrome to determine location of errors within the plurality of data qubits, and an error register configured to store locations of the determined errors.

21 Claims, 4 Drawing Sheets

(56) References Cited

U.S. PATENT DOCUMENTS 9,269,052 B2 * 2/2016 Svore ............... G06N 99/002
9,286,154 B2 * 3/2016 Ashikhmin ............ G06F 11/10

OTHER PUBLICATIONS

Poulin, David, "Optimal and efficient decoding of concatenated quantum block codes." *Physical Review A* 74.5 (2006): 052333.
Poulin, David, and Yeojin Chung. "On the iterative decoding of sparse quantum codes." *Quantum Information & Computation* 8.10 (2008): 987-1000.
Herr, et al.: "*Superconductive Gate System*", U.S. Appl. No. 14/325,518, filed Jul. 8, 2014.
International Search Report & Written Opinion for corresponding PCT/US2016/031500, mailed Sep. 5, 2016.
Fowler: "*Time-optional Quantum Computation*"; arXiv:1210.4626v3, Feb. 2, 2013, XP055295771, retrieved from the internet: URL:http://arxiv.org/abs/1210.4626v3 [retrieved on Feb. 5, 2013]; * entire document*.
Hornibrook, et al.: "*Cryogenic Control Architecture for Large-Scale Quantum Computing*"; Physical Review Applied, vol. 3, 024010, Feb. 23, 2015, XP055295774, DOI: 10.1103/PhysRevAppied.3.024010 sections II and III.
Oberg: "*Reciprocal Quantum Logic*"; Superconducting Logic Circuits Operatin with Reciprocal Magnetic Flux Quanta, 2011, pp. 41-82, XP055295768, University of Maryland, ISBN: 978-1-26-719284-4, chapter 2.
Terhal: "*Quantum Error Correction for Quantum Memories*"; Reviews of Modern Physics, vol. 87, No. 2, Apr. 7, 2015, pp. 307-346, XP055291083, DOI: 10.1103/RevModPhys.87.307 sections II and III.

* cited by examiner

FAULT TOLERANT SYNDROME EXTRACTION AND DECODING IN BACON-SHOR QUANTUM ERROR CORRECTION

TECHNICAL FIELD

The invention relates generally to quantum computing, and more specifically, to fault-tolerant syndrome extraction and decoding in Bacon-Shor quantum error correction.

BACKGROUND

Quantum information processing requires large numbers and high densities of qubits to implement quantum algorithms and even greater amounts of classical control and readout hardware to operate the qubits. In the field of superconducting qubits, there is a need for high density, cryogenic hardware capable of the control and readout of qubits. The qubit with the current record for coherence times and process fidelities, the transmon, is currently controlled with bulky room temperature microwave equipment.

SUMMARY

In one example, a quantum system includes an array of qubits configured to store an item of quantum information. The array of qubits includes a plurality of data qubits and a plurality of measurement qubits configured to extract a syndrome representing agreement among the plurality of data qubits. The quantum system further includes an integrated circuit comprising validation logic configured to determine if the syndrome is valid, decoding logic configured to evaluate the syndrome to determine location of errors within the plurality of data qubits, and an error register configured to store locations of the determined errors.

In another example, a method is provided for quantum error correction. A syndrome is extracted from an array of qubits. It is determined if the extracted syndrome is a valid syndrome. A bitwise exclusive OR is computed between the extracted syndrome and a most recent valid syndrome if the extracted syndrome is valid. The computed bitwise exclusive OR is decoded to determine the locations of qubits whose error states have changed. An error register representing locations within the array of qubits is updated with the determined locations.

In yet another example, a quantum system includes an array of qubits configured to store an item of quantum information. The array of qubits includes a plurality of data qubits and a plurality of measurement qubits configured to extract a syndrome representing agreement among the plurality of data qubits. The quantum system further includes an integrated circuit implemented using reciprocal quantum logic. The integrated circuit includes validation logic configured to determine if the syndrome is valid, decoding logic configured to evaluate the syndrome to determine location of errors within the plurality of data qubits, and an error register configured to store locations of the determined errors.

BRIEF DESCRIPTION OF THE DRAWINGS

The features, objects, and advantages of the invention will become more apparent from the detailed description set forth below when taken in conjunction with the drawings, wherein.

DETAILED DESCRIPTION OF THE INVENTION

Systems and methods are provided for extracting and decoding the error syndrome in a quantum data array using a Bacon-Shor quantum error correction code. In one example, the system is implemented as an RQL circuit that implements the syndrome extraction method, performs the decode logic, and tracks the decoded errors. The measurement of multi-qubit (Pauli) check operators can be used to diagnose the locations of errors through a classical computation known as syndrome decoding. These check operators correspond to the parity checks of classical linear coding. In fact, for many quantum codes the process of decoding the syndrome can be reduced to decoding a pair of classical binary linear codes. This is the case for the Bacon-Shor codes, where syndrome decoding for a Bacon-Shor code with $n^2$ qubits can be mapped onto two instances of the syndrome-decoding problem for the n-bit classical repetition code. In the system presented herein, the qubits of the Bacon-Shor code can be arranged on a grid such that each column corresponds to a single bit of a classical repetition code which is used to diagnose X errors, while each row corresponds to a single bit of a classical repetition code in the Hadamard rotated basis which is used to diagnose Z errors. An overcomplete basis for the check operators is given by $Z_{ij}Z_{ik}$ and $X_{ji}X_{ki}$ where X and Z are the standard Pauli operators and the first index indicates the row and the second indicates the column of the qubit on which the operator acts. If the measurement outcomes are represented by 0 and 1, then the syndrome bits have the form $\Sigma_{i=0}^{n} Z_{ij}Z_{ik}$ mod 2, which corresponds to the parity of the $j^{th}$ and $k^{th}$ bit of the repetition code used to diagnose X errors, and $\Sigma_{i=0}^{n} X_{ji}X_{ki}$ mod 2, which corresponds to the parity of the $j^{th}$ and $k^{th}$ bit of the repetition code used to diagnose Z errors.

Given perfect extraction, these syndromes indicate the locations of errors in the corresponding classical repetition codes and thereby the columns or rows which contain X or Z errors. For the Bacon-Shor codes, even numbers of X errors in a column or even numbers of Z errors in a row or column are harmless, which consequently implies that the position of a single X or Z error in a column or row is unimportant. The quantum gates that are used to extract the syndrome bits will unavoidably be faulty, so the system measures the check operators and processes the syndrome bits in a manner that is robust against failures. This is achieved by ensuring that the process of extracting the syndrome and acting upon it is fault tolerant, meaning that t quantum-gate failures during this process cannot lead to more than t errors on a quantum code block so long as t is less than the number of correctable errors for the code.

Figure 1:
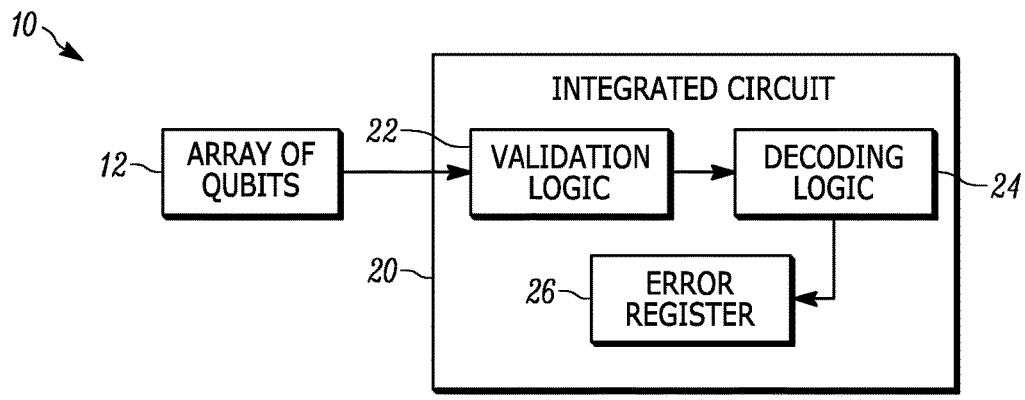
FIG. 1 illustrates a quantum system utilizing error correction.

FIG. 1 illustrates a quantum system 10 utilizing error correction. The system 10 includes an array of qubits 12 configured to store an item of quantum information. The array of qubits 12 includes a plurality of data qubits and a plurality of measurement qubits configured to extract a syndrome representing agreement among the plurality of data qubits. In one implementation, the array of qubits includes twenty-five data qubits, arranged in a grid, with fifty measurement qubits interposed between adjacent pairs of the data qubits, assuming cyclic boundary conditions. The plurality of measurement qubits configured to extract a first syndrome representing agreement among the plurality of data qubits with respect to a first basis, such as X errors, and a second syndrome representing agreement among the plurality of data qubits with respect to a second basis, such as Z errors. In such a case, half of the measurement qubits will be applied to each basis. In one example, the measurement qubits in a given row detect X-basis errors and the measurement qubits within a column detect Z-basis errors.

The system 10 further includes an integrated circuit 20 configured to process the extracted syndrome and update the error state of the quantum system 10. It will be appreciated that the integrated circuit 20, including the validation logic 22, the decoding logic 24, and the error register 26, can be implemented in reciprocal quantum logic in one implementation, allowing the logic to be located inside of the cryogenic region of the quantum system 10. In practice, the integrated circuit 20 can be implemented as a complementary metal-oxide semiconductor, an application specific integrated circuit chip, or a field-programmable gate array.

The integrated circuit 20 includes validation logic 22 configured to determine if the syndrome is valid. In one implementation, the validation logic 22 is configured to determine if the extracted syndrome has an even number of bits representing mismatches between adjacent qubits, and is thus a valid syndrome. Any invalid syndromes can be rejected and a new extraction of the syndrome can be performed. Additionally or alternatively, the plurality of measurement qubits can be configured to extract a first syndrome representing agreement among the plurality of data qubits with respect to a first basis and a second syndrome representing agreement among the plurality of data qubits with respect to the first basis. With these two extracted syndromes, the validation logic 22 can compare the first syndrome to the second syndrome and reject the extracted syndromes if the first syndrome does not match the second syndrome.

In another implementation, the syndrome can also be compared to a most recent valid syndrome, that is, the last syndrome to successfully pass whatever other validation is utilized, and refrain from passing the syndrome to the decoding logic 24 and the error register 26 if the extracted syndrome is identical to the most recent valid syndrome. This allows for a savings in power consumption when there is no change to the error state of the system. In one example, the validation logic 22 is configured to compute a bitwise exclusive OR between corresponding bits of the extracted syndrome and the most recent valid syndrome to provide an update syndrome and pass the update syndrome to the decoder logic 24. As will be discussed in detail below, the decoder logic 24 is completely inactive when provided with a null [00000] syndrome, and this is functionally equivalent to providing nothing to the decoder logic 24.

The integrated circuit 20 further includes decoding logic 24 configured to evaluate the syndrome to determine location of errors within the plurality of data qubits. It will be appreciated that the evaluation of the syndrome can include evaluation of an XOR of the extracted syndrome with the last valid syndrome to evaluate a change in the error state of the system from a previous state. This configuration can be particularly effective when the integrated circuit 20 is implemented in reciprocal quantum logic. In such a case, the decoding logic 24 can be implemented such that it remains inactive when provided with a null syndrome, in other words, have no bits representing a change in the error state, none of a plurality of Josephson junctions comprising the decoder logic are triggered. It will be appreciated that this can sharply reduce the power consumption of the device. Where the decoder logic 24 is implemented as in reciprocal quantum logic, the decoder logic can include one or more AndOr gates, AnotB gates, and delay components implemented as Josephson transmission lines.

An error register 26 is configured to store locations of the determined errors. In one implementation, the error register includes a first error register, storing locations in errors in the first basis and a second error register, storing locations in errors in the second basis, although since the extractions are performed independently, the two will be discussed separately below. In one example, the error register 26 is implemented as a plurality of flip-flops, with each flip-flop representing one of a plurality of locations within the array. Where incremental updating is used, with a decoding of the locations that have changed since a last valid syndrome, the decoding logic 24 can simply provide, for each location for which a change in the error state has been detected, a bit to a T input of a corresponding flip-flop to adjust the stored error state.

Figure 2:
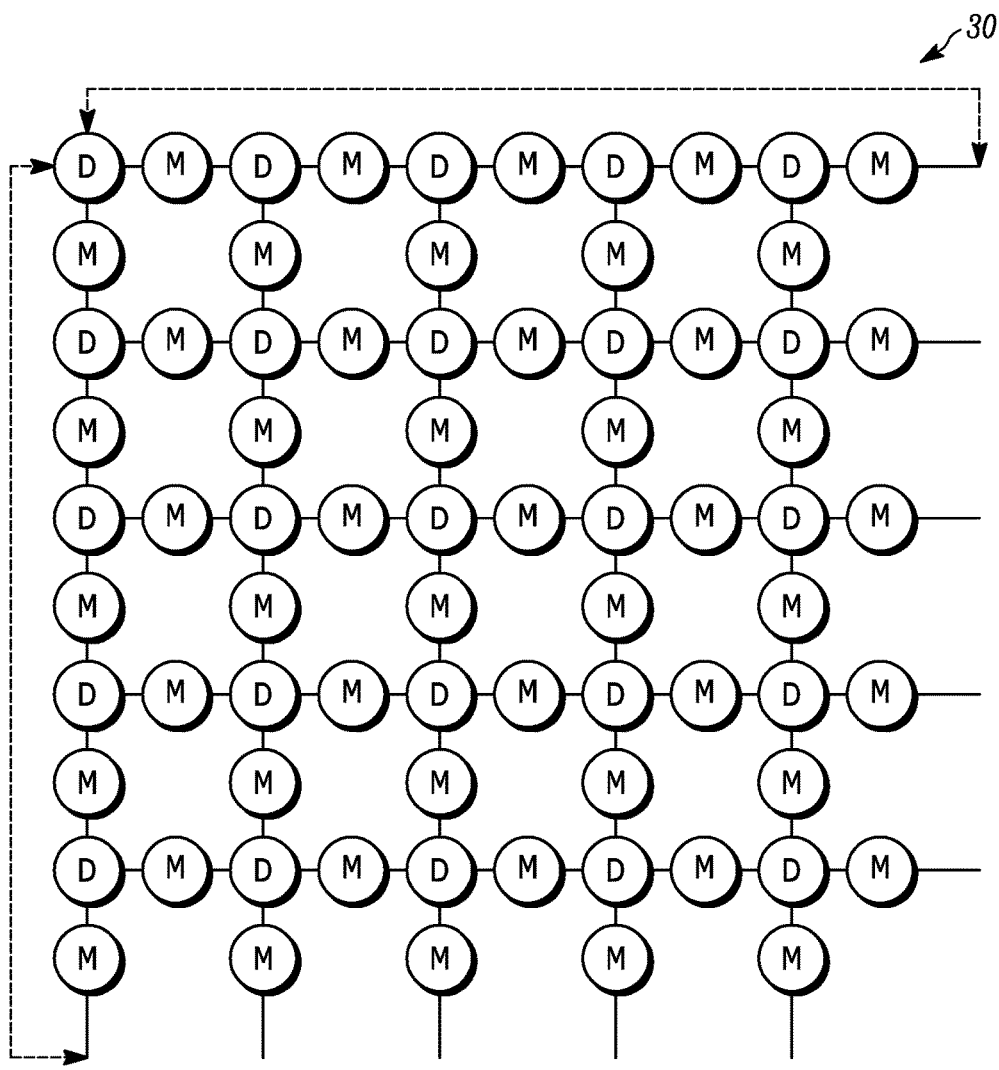
FIG. 2 illustrates an array of data and measurement qubits with nearest neighbor interactions for determining a syndrome for each row and column.

FIGS. 2-5 collectively illustrate one implementation of a quantum system for extracting and decoding a Bacon-Shor quantum error correction code in a twenty-five qubit system. FIG. 2 illustrates an array 30 of data and measurement qubits with nearest neighbor interactions for determining a syndrome for each row and column. In the illustrated array, there are twenty-five data qubits, labeled with "D", and fifty measurement qubits, labeled with "M." Each pair of neighboring data qubits have a measurement qubit interposed between them, with the qubits on the end of a row or column also treated as neighbors, that is, the boundary conditions are cyclic. In the illustrated implementation, each measurement qubit can perform a check operation representing the data qubits on either side of the measurement qubit. Using this array, the procedure for fault-tolerant quantum error correction for a twenty-five qubit Bacon-Shor code begins by measuring all check operators with support on qubits that are adjacent when laid out on the grid, keeping in mind the cyclic boundary conditions. In one implementation, the Z-type check operators are first measured in parallel, generating five check values for each row, and then the X-type check operators are measured in parallel. Accordingly, each row will generate five check values, used to detect errors in the Z basis, and, similarly, each column will generate five check values, used to detect errors in the X basis. In one implementation, these values will be XORed together to produce a single syndrome for each of the X basis and the Z basis.

Figure 3:
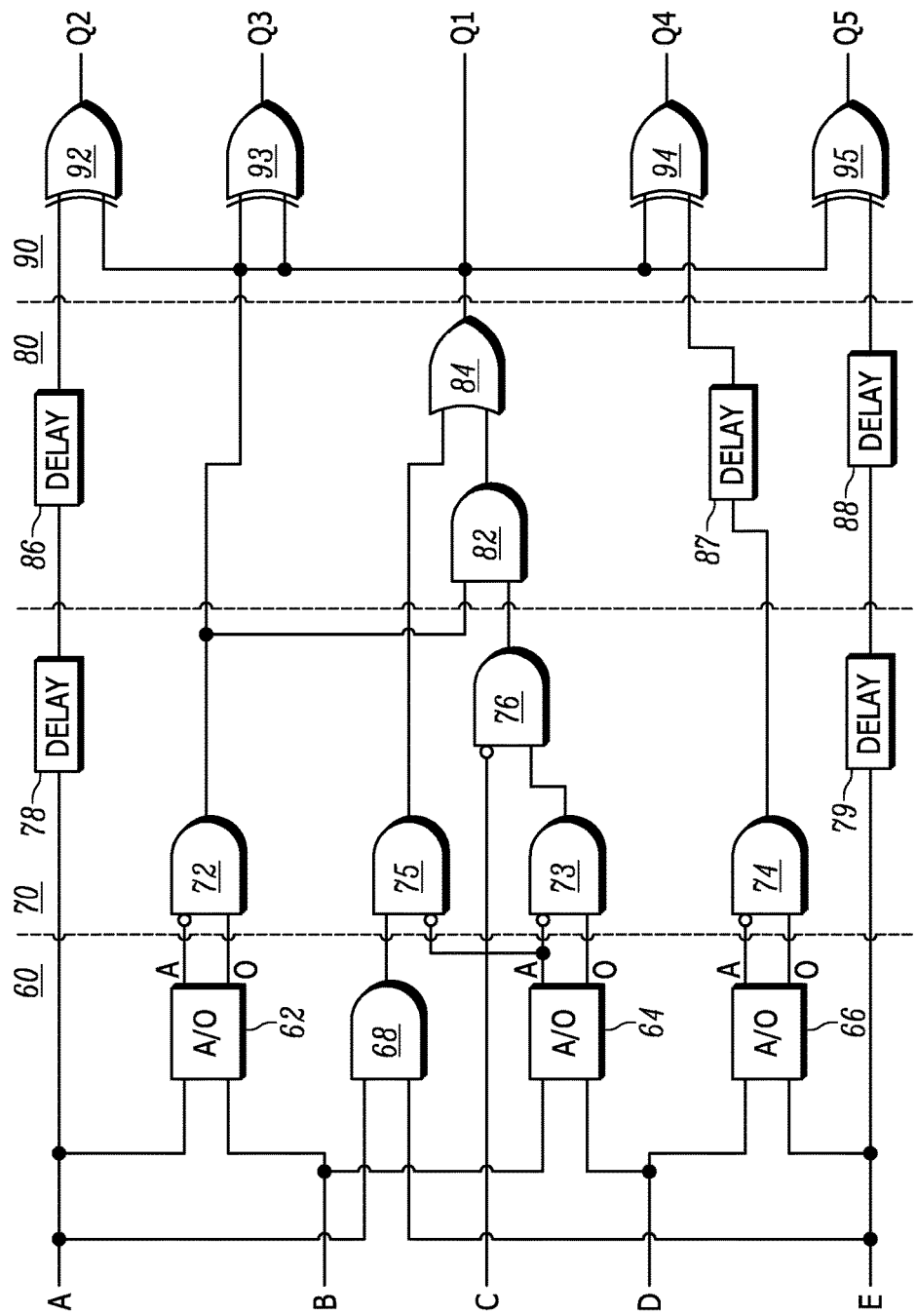
FIG. 3 illustrates a circuit for decoding a five-bit syndrome.

It will be appreciated that the syndrome collected from the array only indicates a mismatch between adjacent qubits, and that further decoding is necessary to indicate which qubit or qubits contain the indicated error. FIG. 3 illustrates a circuit 50 for decoding a five-bit syndrome. Specifically, FIG. 3 provides one example of a circuit for implementing the truth table included here as Table 1 in a single clock cycle.

TABLE 1

| Syndrome | Error |
|---|---|
| 00000 | 00000 |
| 00011 | 00001 |
| 00101 | 00011 |
| 00110 | 00010 |
| 01001 | 11000 |
| 01010 | 00110 |
| 01100 | 00100 |
| 01111 | 00101 |
| 10001 | 10000 |
| 10010 | 10001 |
| 10100 | 01100 |
| 10111 | 10010 |
| 11000 | 01000 |
| 11011 | 01001 |
| 11101 | 10100 |
| 11110 | 01010 |

The circuit 50 of FIG. 3 utilizes reciprocal quantum logic (RQL) to implement the truth table in a single clock cycle. It will be appreciated that each of the sets of logical components 60, 70, 80, and 90 represent separate RQL clock phases. The circuit is implemented with RQL AndOr (A/O) and AnotB gate, XOR, AND, and OR gates that can be derived from the AndOr and AnotB gates, and delay blocks, implemented with RQL Josephson transmission lines. In the illustrated implementation, the circuit 50 contains approximately one hundred and twenty Josephson junctions, of which at most approximately seventy percent are active at any given time. In addition, the zero-syndrome word [00000], which decodes to the zero error-location word [00000], does not involve any of the junctions switching. As will be discussed in detail below, this is also the idle state of the decoder, and therefore no power is dissipated in the decoder when it is idle.

A first set of logical components 60 includes first, second and third AndOr gates 62, 64, and 66 and a first AND gate 68. The first AndOr gate 62 receives a first syndrome bit (A) and a second syndrome bit (B) as inputs, and outputs each of the logical AND and logical OR of these two bits. The second AndOr gate 64 receives the second syndrome bit (B) and a fourth syndrome bit (D) as inputs, and outputs each of the logical AND and logical OR of these two bits. The third AndOr gate 66 receives the fourth syndrome bit (D) and a fifth syndrome bit (E) as inputs, and outputs each of the logical AND and logical OR of these two bits. The first AND gate 68 receives the first syndrome bit (A) and the fifth syndrome bit (E) as inputs and outputs a logical AND between these bits.

A second set of logical components 70 includes five AnotB gates 72-76 and two delay components 78 and 79. A first AnotB gate 72 receives the logical AND and logical OR from the first AndOr gate 62 as inputs, with the logical AND as the negated input. An output representing logical truth is provided by the first AnotB gate 72 only when the logical OR of the first and second syndrome bits is true, and the AND is not true. Effectively, the first AnotB gate 72 and the first AndOr gate 62 collectively form a logical XOR between the first and second syndrome bits. Similarly, a second AnotB gate 73 receives the logical AND and logical OR from the second AndOr gate 64 as inputs, with the logical AND as the negated input, to provide a logical XOR between the second and fourth syndrome bits, and a third AnotB gate 74 receives the logical AND and logical OR from the third AndOr gate 66 as inputs, with the logical AND as the negated input, to provide a logical XOR between the fourth and fifth syndrome bits.

A fourth AnotB gate 75 receives the AND output from the second AndOr gate 64 as a negated input and the output of the first AND gate 68 as a second input. Effectively, the fourth AnotB gate provides an output representing logical truth only when the first and fifth syndrome bits are ones and at least one of the second and fourth syndrome bits is a zero. A fifth AnotB gate 76 receives the third syndrome bit (C) as a negated input and the output of the second AnotB gate 73 as a second input. Effectively, the fifth AnotB gate 76 provides an output representing logical truth when the third syndrome bit is a zero and the second and fourth syndrome bits have different values. A first delay component 78 buffers a value of the first syndrome bit while the active components 62, 64, 66, 68, and 72-76 are functioning. Similarly, a second delay component 79 buffers a value of the fifth syndrome bit.

A third set of logical components 80 includes a second AND gate 82, an OR gate 84, and third, fourth, and fifth delay components 86-88. The second AND gate 82 receives the output of the first AnotB gate 72 as a first input and the output of fifth AnotB gate 76 as a second output. Effectively, the second AND gate 82 will provide an output representing logical truth if the third syndrome bit is a zero and if the exclusive OR between the second syndrome bit and the logical AND of the first and fourth syndrome is true. Symbolically, the output of the gate can be represented as: $\sim C \cap [(B \oplus A) \cap (B \oplus D)]$. The OR gate 84 receives the output of the second AND gate 82 as a first input and the output of the fourth AnotB gate 75 as a second input. The fourth AnotB gate 75 provides an output representing logical truth only when both the first and the fifth syndrome bits are ones, and at least one of the second and fourth syndrome bits are a zero. Accordingly, the output of the OR gate 84 can be represented symbolically as: $\langle \sim C \cap [(B \oplus A) \cap (B \oplus D)] \rangle \cup \langle (A \cap E) \cap \sim (B \cap D) \rangle$. The output of the OR gate 84 indicates whether the first qubit in the set contains an error, with an output from the OR gate representing logical truth indicating an error in the first qubit (Q1). The third delay component 86 buffers a value of the first syndrome bit while the active components 82 and 84 are functioning. Similarly, the fourth delay component 87 buffers the output of the third AnotB gate 74 and the fifth delay component 88 buffers a value of the fifth syndrome bit.

A fourth set of logical components 90 includes four XOR gates 92-95. Each of the XOR gates 92-95 receives the output of the OR gate 84 as a first input. A first XOR gate 92 receives the delayed first syndrome bit as a second input, and provides an output representing an error in the second qubit (Q2). A second XOR gate 93 receives the output of the first AnotB gate 72 as a second input, and provides an output representing an error in the third qubit (Q3). A third XOR gate 94 receives the output of the third AnotB gate 74 as a second input, and provides an output representing an error in the fourth qubit (Q4). A fifth XOR gate 95 receives the delayed fifth syndrome bit as a second input, and provides an output representing an error in the fifth qubit (Q5). Accordingly, the circuit 50 decodes a provided syndrome to indicate the specific location of errors within the array.

In practice, as the error-correction algorithm progresses in time, it is desirable to keep track of errors, and update the error-location register only when the error state changes. It is sufficient to track and propagate errors as classical data through Clifford group quantum gates. Errors have to be corrected only when performing a non-Clifford gate. In the illustrated implementation of FIGS. 2-5, tracking the errors utilizes an XOR operation between the current valid syndrome word and the last valid syndrome word to determine an update to the syndrome vector. Only those bits that are different between the current and last valid syndromes should be decoded. The decoded syndrome vector is then XORed into the error location register, essentially performing an incremental update on the error state. On the hardware level, the incremental updates into the error location register can be easily done if the register bits are implemented as T flip-flops.

Figure 4:
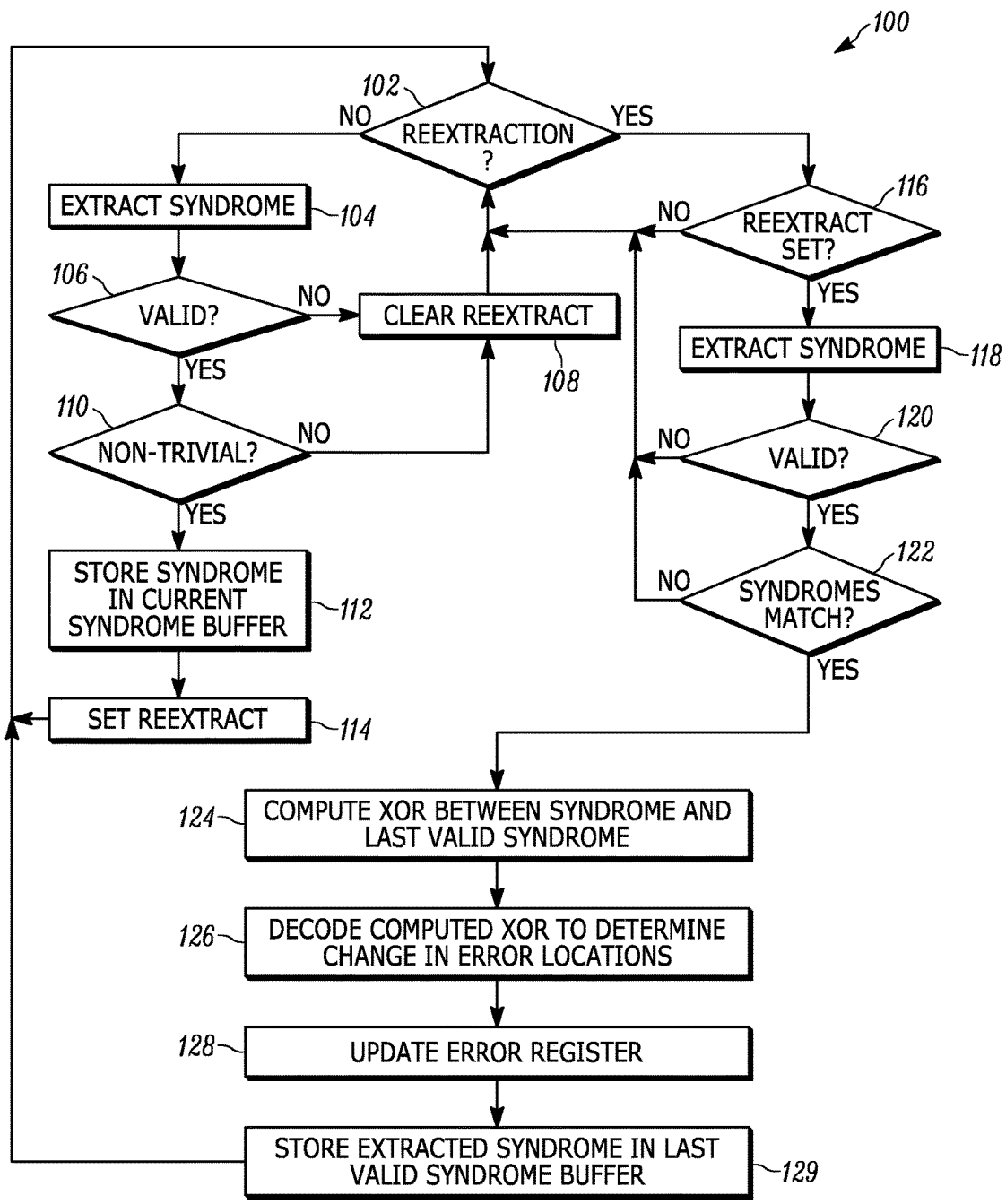
FIG. 4 illustrates a method for tracking quantum errors in an array of data qubits.
Figure 5:
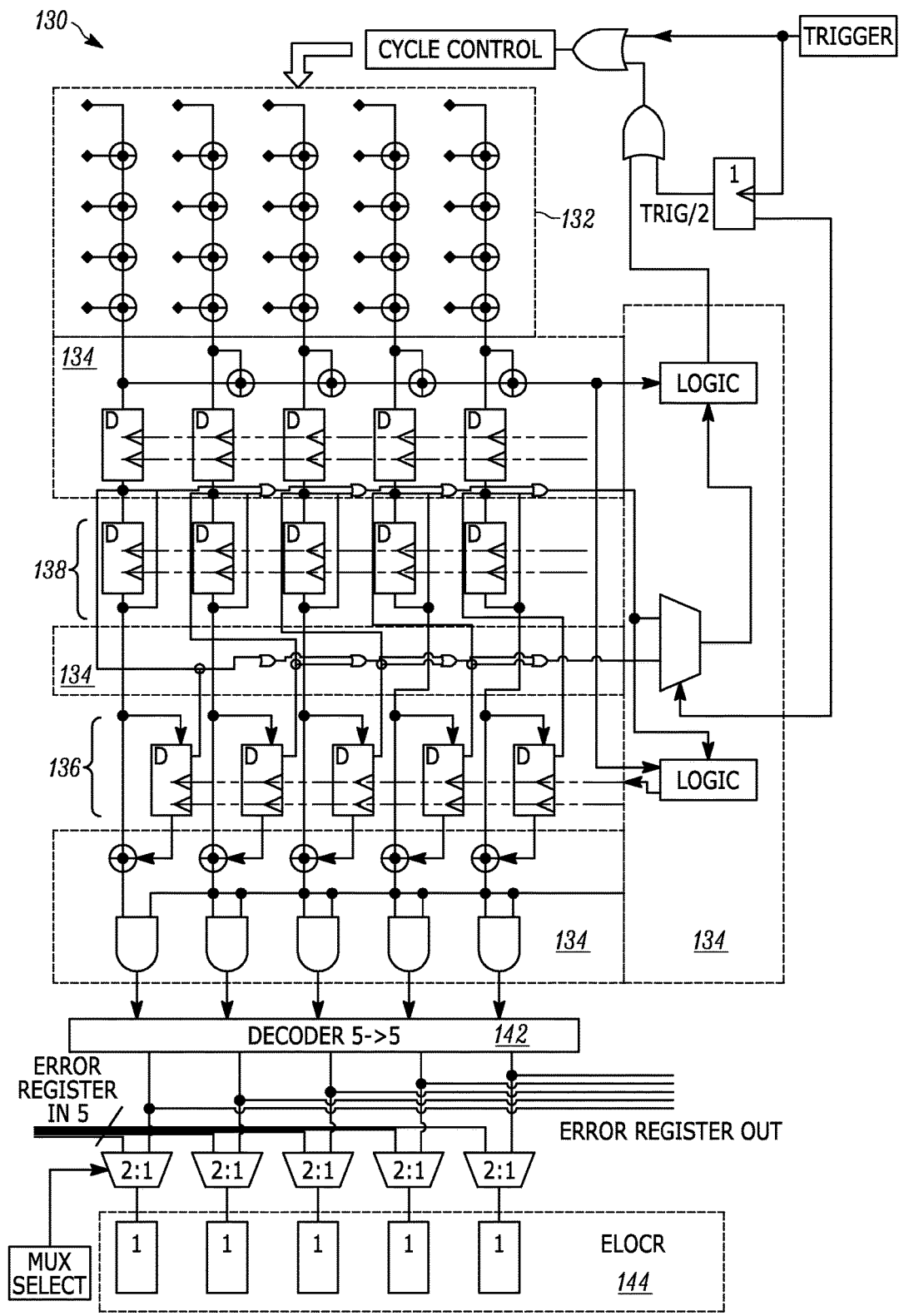
FIG. 5 illustrates a system for implementing the method of FIG. 4.

To this end, FIG. 4 illustrates a method 100 for tracking quantum errors in an array 132 of data qubits. FIG. 5 illustrates a system 130 for implementing the method of FIG. 4. At 102, it is determined if this is a reextraction for a given syndrome, for example, for the purpose of verification. If not (N), the method advances to 104, where the syndrome is extracted from the array 132, and the method advances to 106. In this process, the measurement outcomes for check operators spanning the same rows, the Z-type measurements, or the columns, the X-type measurements, are XORed together to obtain the syndrome bits. Looking at the array in FIG. 5, data inputs to the circuit are the twenty-five diamond-shaped ports within the array 132. Each input carries a classical bit resulting from a readout of the measurement qubits, and represents the value of a parity check operator. The twenty-five inputs are XORed in groups of five, corresponding to the five columns or rows of qubits measuring X-parity or Z-parity, respectively. There are five X-syndrome bits and five Z-syndrome bits.

At 106, it is determined if the syndrome is valid at associated validation logic 134. In the illustrated process, the syndrome bits for diagnosing X errors and those for diagnosing Z errors are each independently processed, and the following discussion will assume a single, five-bit syndrome. In one implementation, the syndrome is valid if it contains an even number of logical ones. If the syndrome is not valid (N), a reextract flag is cleared at 108, and the system returns to 102. If the syndrome is valid (Y), the method continues to 110, where it is determined if the syndrome is non-trivial compared to the last-known valid syndrome. Specifically, the stored syndrome can be compared to a syndrome stored in a last valid syndrome buffer 136 to determine if the error state of the system has changed. If the syndromes are the same (N), a reextract flag is cleared at 108, and the system returns to 102. If the syndromes are not the same (Y), it is stored in the current syndrome buffer 138 at 112 and a re-extract flag is set at 114. The method then returns to 102.

Returning to 102, if it is determined that this is not the first extraction for a given syndrome (Y), the method advances to 116 where it is determined if the reextract flag is set. This can be performed by the validation logic 134. If the reextract is not set (N), the method idles for the remainder of the clock cycle and returns to 102. If the reextract is set (Y), the method advances to 118, where a second syndrome is extracted. At 120, it is determined if the second syndrome is valid. If not (N), the method returns to 102. If so (Y), the method advances to 122, where it is determined if the second syndrome matches the first extracted syndrome. If the two syndromes do not match (N), the method returns to 102. If the two syndromes match (Y), the method advances to 124, where respective XOR operations are performed between corresponding bits of the last valid syndrome and the extracted syndrome. The resulting value is provided to a decoder 142, such as the one illustrated in FIG. 3, to determine if the error state of any of the locations in the array have changed at 126. The new error state can then be provided to an error register 144 at 128, and the newly validated syndrome can be stored in the last valid syndrome buffer 136 at 129.

Only those bits that are different between the current and last valid syndromes are decoded in the circuit of FIG. 5. The decoded syndrome vector is then XORed into the error location register, essentially performing an incremental update on the error state. On the hardware level, the incremental updates into the error location register can be easily done if the register bits are implemented as T flip-flops. A multiplexer at the input of error register allows for exchange of information with other error-correcting units and facilitates error propagation between logical qubits when performing a logical Clifford gate. The method then returns to 102 to extract another syndrome.

The simplicity of the control method makes it amenable to coding in hardware. An application specific integrated circuit implementing the control system can be realized in reciprocal quantum logic (RQL) and placed on the same chip as the qubits, or on a separate chip mounted in proximity to the qubit chip, for example using a multi-chip carrier module. Since all data paths carry classical information, the controller can be also implemented in CMOS technology. When implemented in RQL, the circuit will involve approximately fifteen hundred Josephson junctions, and take approximately ten RQL clock cycles per extraction. Between extractions, the circuit is idle and does not dissipate power. The average activity factor of the circuit is expected to be less than two percent. From this, it is possible to estimate the average power dissipation as a function of clock rate and RQL junction parameters. For realistic parameters, the average power dissipation on chip is of the order of a nanowatt.

The invention has been disclosed illustratively. Accordingly, the terminology employed throughout the disclosure should be read in an exemplary rather than a limiting manner. Although minor modifications of the invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

Having described the invention, we claim:

1. A quantum system comprising:
   an array of qubits configured to store an item of quantum information, the array of qubits including a plurality of data qubits and a plurality of measurement qubits configured to extract a syndrome representing agreement among the plurality of data qubits;
   an integrated circuit, implemented using reciprocal quantum logic, comprising:
   validation logic configured to determine if the syndrome is valid;
   decoding logic configured to evaluate the syndrome to determine location of errors within the plurality of data qubits; and
   an error register configured to store locations of the determined errors.

2. The quantum system of claim 1, wherein the decoding logic comprises at least one AndOr gate and at least one AnotB gate.

3. The quantum system of claim 1, wherein the decoder comprises a plurality of Josephson junctions and is configured such that, when a syndrome having zero bits representing a change in the error state at their associated location is provided to the decoder, none of the Josephson junctions are triggered.

4. The quantum system of claim 3, wherein the validation logic is configured to compute a bitwise exclusive OR between corresponding bits of the extracted syndrome and a most recent valid syndrome to provide an update syndrome and pass the update syndrome to the decoder logic.

5. The quantum system of claim 1, wherein the decoder includes at least one delay component implemented as a Josephson transmission line.

6. The quantum system of claim 1, wherein the error register is implemented as a plurality of flip-flops, each flip-flop representing one of a plurality of locations within the array.

7. The quantum system of claim 6, wherein the decoding logic provides a bit for each of the plurality of locations within the array to a T input to respective flip-flops of the plurality of flip-flops, the provided bits representing a change in the error state at their associated location.

8. The quantum system of claim 1, wherein the validation logic is configured to compare the exacted syndrome to a most recent valid syndrome and refrain from passing the syndrome to the decoding logic and the error register if the extracted syndrome is identical to the most recent valid syndrome.

9. The quantum system of claim 8, wherein the validation logic is configured to compute a bitwise exclusive OR between corresponding bits of the extracted syndrome and the most recent valid syndrome to provide an update syndrome and pass the update syndrome to the decoder logic.

10. The quantum system of claim 1, wherein the plurality of measurement qubits are configured to extract a first syndrome representing agreement among the plurality of data qubits with respect to a first basis and a second syndrome representing agreement among the plurality of data qubits with respect to the first basis and the validation logic is configured to compare the first syndrome to the second syndrome and reject the extracted syndromes if the first syndrome does not match the second syndrome.

11. The quantum system of claim 1, wherein the plurality of measurement qubits configured to extract a first syndrome representing agreement among the plurality of data qubits with respect to a first basis and a second syndrome representing agreement among the plurality of data qubits with respect to a second basis, the error register comprising a first error register, storing locations in errors in the first basis and the quantum system further comprising a second error register, storing locations in errors in the second basis.

12. The quantum system of claim 1, wherein the validation logic is configured to determine if the extracted syndrome has an even number of bits representing mismatches between adjacent qubits.

13. A method for quantum error correction comprising:
extracting a syndrome from an array of qubits;
determining if the extracted syndrome is a valid syndrome;
computing a bitwise exclusive OR between the extracted syndrome and a most recent valid syndrome if the extracted syndrome is valid;
decoding the computed bitwise exclusive OR to determine the locations of qubits whose error states have changed; and
updating an error register, implemented on an integrated circuit, representing locations within the array of qubits with the determined locations.

14. The method of claim 13, wherein extracting the syndrome from an array of qubits comprises extracting a first syndrome from the array of qubits, the method further comprising:
extracting a second syndrome from the array of qubits; and
comparing the first extracted syndrome to the second extracted syndrome;
wherein computing the bitwise exclusive OR between the extracted syndrome and the most recent valid syndrome comprises bitwise exclusive OR between the extracted syndrome and the most recent valid syndrome if the first extracted syndrome is valid and the first syndrome is the same as the second extracted syndrome.

15. The method of claim 14, wherein determining if the extracted first syndrome is a valid syndrome comprises determining if the extracted syndrome has an even number of bits representing mismatches between adjacent qubits.

16. A quantum system comprising:
an array of qubits configured to store an item of quantum information, the array of qubits including a plurality of data qubits and a plurality of measurement qubits configured to extract a first syndrome representing agreement among the plurality of data qubits with respect to a first basis and a second syndrome representing agreement among the plurality of data qubits with respect to the first basis;
an integrated circuit comprising:
validation logic configured to determine if the syndrome is valid and to compare the first syndrome to the second syndrome and reject the extracted syndromes if the first syndrome does not match the second syndrome;
decoding logic configured to evaluate the syndrome to determine location of errors within the plurality of data qubits; and
an error register configured to store locations of the determined errors.

17. The quantum system of claim 16, wherein the integrated circuit is implemented as a complementary metal-oxide semiconductor.

18. The quantum system of claim 16, wherein the integrated circuit is implemented as an application specific integrated circuit chip.

19. The quantum system of claim 16, wherein each of the validation logic, the decoding logic, and the error register is implemented as reciprocal quantum logic.

20. The quantum system of claim 19, wherein the decoder comprises a plurality of Josephson junctions and is configured such that, when a syndrome having zero bits representing a change in the error state at their associated location is provided to the decoder, none of the Josephson junctions are triggered.

21. The quantum system of claim 16, wherein the integrated circuit is implemented as a field programmable gate array.

* * * * *